(12) United States Patent
Zhu et al.

(10) Patent No.: US 7,615,831 B2
(45) Date of Patent: Nov. 10, 2009

(54) STRUCTURE AND METHOD FOR FABRICATING SELF-ALIGNED METAL CONTACTS

(75) Inventors: Huilong Zhu, Poughkeepsie, NY (US); Werner Rausch, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/925,168

(22) Filed: Oct. 26, 2007

(65) Prior Publication Data

US 2009/0108378 A1   Apr. 30, 2009

(51) Int. Cl.
*H01L 31/119* (2006.01)
(52) U.S. Cl. .................. 257/413; 257/412; 257/369
(58) Field of Classification Search .................. 257/369, 257/412, 413
See application file for complete search history.

(56) References Cited

U.S. PATENT DOCUMENTS

| | | | |
|---|---|---|---|
| 5,670,812 | A | 9/1997 | Adler et al. |
| 5,675,185 | A | 10/1997 | Chen et al. |
| 5,744,384 | A | 4/1998 | Adler et al. |
| 5,757,050 | A | 5/1998 | Adler et al. |
| 6,022,766 | A | 2/2000 | Chen et al. |
| 6,713,791 | B2 | 3/2004 | Hsu et al. |
| 6,908,850 | B2 | 6/2005 | Doris et al. |
| 6,930,030 | B2 | 8/2005 | Rausch et al. |
| 6,939,751 | B2 | 9/2005 | Zhu et al. |
| 7,098,536 | B2 | 8/2006 | Yang et al. |
| 7,105,440 | B2 | 9/2006 | Luo et al. |
| 7,135,724 | B2 | 11/2006 | Chen et al. |
| 2002/0100918 | A1 | 8/2002 | Hsu et al. |
| 2004/0248348 | A1 | 12/2004 | Rausch et al. |
| 2005/0054169 | A1 | 3/2005 | Wagner et al. |
| 2005/0055494 | A1 | 3/2005 | Doris et al. |
| 2005/0090066 | A1 | 4/2005 | Zhu et al. |
| 2005/0093030 | A1 | 5/2005 | Doris et al. |
| 2005/0158937 | A1 | 7/2005 | Yang et al. |
| 2005/0263825 | A1* | 12/2005 | Frohberg et al. ............ 257/369 |
| 2006/0065914 | A1 | 3/2006 | Chen et al. |
| 2006/0091471 | A1* | 5/2006 | Frohberg et al. ............ 257/369 |
| 2006/0099793 | A1 | 5/2006 | Yang et al. |
| 2006/0148215 | A1 | 7/2006 | Zhu et al. |
| 2006/0154413 | A1 | 7/2006 | Luo et al. |
| 2006/0163670 | A1* | 7/2006 | Ellis-Monaghan et al. .. 257/388 |

(Continued)

OTHER PUBLICATIONS

Pan, J., et al., "Novel Approach to Reduce Source/drain Series Resistance in High Performance CMOS Devices Using Self-Aligned CoWP Process for 45 nm Node UTSOI Transistors with 20 nm Gate Length", VLSI 2006.

*Primary Examiner*—Long Pham
(74) *Attorney, Agent, or Firm*—Scully, Scott, Murphy & Presser, P.C.; Joseph P. Abate, Esq.

(57) ABSTRACT

A semiconductor structure including at least one transistor is provided which has a stressed channel region that is a result of having a stressed layer present atop a gate conductor that includes a stack comprising a bottom polysilicon (polySi) layer and a top metal semiconductor alloy (i.e., metal silicide) layer. The stressed layer is self-aligned to the gate conductor. The inventive structure also has a reduced external parasitic S/D resistance as a result of having a metallic contact located atop source/drain regions that include a surface region comprised of a metal semiconductor alloy. The metallic contact is self-aligned to the gate conductor.

20 Claims, 10 Drawing Sheets

U.S. PATENT DOCUMENTS

| | | |
|---|---|---|
| 2006/0172500 A1 | 8/2006 | Yang et al. |
| 2006/0199326 A1 | 9/2006 | Zhu et al. |
| 2006/0261477 A1 | 11/2006 | Yang et al. |
| 2006/0292779 A1 | 12/2006 | Chen et al. |
| 2007/0018202 A1 | 1/2007 | Zhu |
| 2007/0018252 A1* | 1/2007 | Zhu .......................... 257/369 |
| 2008/0169510 A1* | 7/2008 | Kumar et al. ............... 257/368 |
| 2009/0017625 A1* | 1/2009 | Lee et al. .................... 438/694 |

* cited by examiner

STRUCTURE AND METHOD FOR FABRICATING SELF-ALIGNED METAL CONTACTS

FIELD OF THE INVENTION

The present invention relates to a semiconductor structure. More particularly, the present invention relates to a semiconductor structure having self-aligned metal via contacts.

BACKGROUND OF THE INVENTION

Field effect transistors (FETs) are the basic building block of today's integrated circuit. Such transistors can be formed in conventional bulk substrates (such as silicon) or in semiconductor-on-insulator (SOI) substrates.

State of the art metal oxide semiconductor (MOS) transistors are fabricated by depositing a gate stack material over a gate dielectric and a substrate. Generally, the MOS transistor fabrication process implements lithography and etching processes to define the conductive, e.g., poly-Si, gate structures. The gate structure and substrate are thermally oxidized, and, after this, source/drain extensions are formed by implantation. Sometimes the implant is performed using a spacer to create a specific distance between the gate and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. The deep source/drain implants are then performed with the thick spacer present. High temperature anneals are performed to activate the junctions after which the source/drain and top portion of the gate are generally silicided. Silicide formation typically requires that a refractory metal be deposited on a Si-containing substrate followed by a process to produce the silicide material. The silicide process forms low resistivity contacts to the deep source/drain regions and the gate conductor.

High integration density can reduce manufacturing costs. In order to be able to make integrated circuits (ICs), such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device and yield degrading effects.

With continuing scaling down of the transistor size, it is required that the size of the via contacts also decreases. It is, however, difficult to etch contact vias and to avoid gate-to-via shorts when the size of the via opening is small and spacing between gates and vias is small. Although thin contact area stressed layers make it easier for etching the via opening, such thin contact area stressed layers reduce the stress transferred into the channel of the transistor. This degrades the performance of the transistor and, as such, is highly undesirable. The gate-to-via shorts reduce chip yields and then increase the costs for IC manufacturing.

In addition to the above, another key challenge in fabricating high performance semiconductor structures is to reduce the external parasitic source/drain (S/D) resistance. Typically, an epitaxial raised S/D is implemented to address this problem. However, the epitaxial raised S/D process adds significant device integration complexity. The pre-epitaxial surface cleans and epitaxial growth conditions are sensitive to the underlying doping species present in the semiconductor substrate and their concentration and require extensive optimization.

In view of the above, there is a need for providing a semiconductor structure that has improved device performance as a result of a stressed channel region without increasing the size of the contact vias. Moreover, there is also a need for providing a semiconductor structure having improved device performance in with the external parasitic S/D resistance is reduced without the need of epitaxially growing a raised S/D semiconductor region. To reduce area penalty due to lithography misalignment, it is desirable to have vias self-aligned to gates.

SUMMARY OF THE INVENTION

The present invention provides a semiconductor structure including at least one transistor which has a stressed channel region that is a result of having a stressed layer present atop a gate conductor that includes a stack comprising a bottom polysilicon (polySi) layer and a top metal semiconductor alloy (i.e., metal silicide) layer. The stressed layer is self-aligned to the gate conductor. The inventive structure also has a reduced external parasitic S/D resistance as a result of having a metallic contact located atop source/drain regions that include a surface region comprised of a metal semiconductor alloy.

In general terms, the inventive semiconductor structure comprises:

at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer and a top surface that includes an etch stop liner and a stressed layer, said etch stop liner is located on a bottom surface and sidewall surfaces of said stressed layer;

a second metal semiconductor alloy layer located within said semiconductor substrate at a footprint of said at least one spacer; and a metallic contact comprising a metal from Group VIII or IB of the Periodic Table of Elements and at least one of W, B, P, Mo and Re located on said second metal semiconductor alloy layer.

In the present invention, the first and second metal semiconductor alloy layers may comprise the same material or a different material. In the present invention, the second metal semiconductor alloy layer is located within a source diffusion region and a drain diffusion region of the at least one transistor.

In one embodiment of the present invention, the semiconductor structure further includes a barrier layer located atop the metallic contact and the at least one transistor.

In a further embodiment of the present invention, a middle-of-the-line (MOL) dielectric including a contact via is located within the structure, wherein the contact via is in contact with the metallic contact. In a yet further embodiment of the present invention, the contact via includes a diffusion barrier liner.

In an even further embodiment of the present invention, the metallic contact comprises CoW, CoP or CoWP, with CoWP being highly preferred.

In a still yet further embodiment of the present invention, a trench isolation region is located within the semiconductor substrate, wherein an outer edge of the trench isolation region is in contact with an edge of the second metal semiconductor alloy layer.

In another embodiment of the present invention, a gate dielectric material is present between the gate conductor stack and the substrate.

In still another embodiment, the etch stop liner and the stressed layer present on the upper layer of the first metal semiconductor alloy each have an upper surface that is below an upper surface of the at least one spacer.

In yet another embodiment of the present invention, a stack of another etch stop layer and another stressed layer is located on a trench isolation region and a portion of the second semiconductor metal alloy layer abutting the trench isolation region. In the present invention, the etch stop layer and the another etch stop layer comprise the same etch stop material, while the stressed layer and the another stressed layer also comprise the same stressed material (either tensile stressed or compressive stress).

In another aspect of the present invention, a semiconductor structure is provided that comprises:

at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer and a top surface that includes an etch stop liner and a stressed layer, said etch stop liner is located on a bottom surface and sidewall surfaces of said stressed layer;

a second metal semiconductor alloy layer located within said semiconductor substrate at a footprint of said at least one spacer;

a metallic contact comprising a metal from Group VIII or IB of the Periodic Table of Elements and at least one of W, B, P, Mo and Re located on said second metal semiconductor alloy layer; and a middle-of-the-line (MOL) dielectric located atop said metallic contact and said at least one transistor, said MOL dielectric including at least one contact via that is in contract with said metallic contact located atop said second metal semiconductor alloy layer.

It is observed that many of the embodiments mentioned above are also applicable here for this aspect of the present invention as well.

In addition to the above, the present invention also provides a method of fabricating the structures mentioned above. In general terms, the method of the present invention comprises:

providing a patterned material stack comprising a lower layer of polysilicon and an upper layer of polysilicon germanium on a surface of a semiconductor substrate, said patterned material stack having sidewalls that are covered by at least one spacer;

removing said upper layer of polysilicon germanium from said patterned material stack;

forming a first metal semiconductor alloy layer within said polysilicon layer and forming a second metal semiconductor alloy layer within said semiconductor substrate at a footprint of said at least one spacer;

forming an etch stop liner and a stressed layer on said first semiconductor alloy layer, wherein said etch stop liner is present on a bottom surface and sidewall surfaces of said stressed liner; and forming a metallic contact comprising a metal from Group VIII or IB of the Periodic Table of Elements and at least one of W, B, P, Mo and Re on said second metal semiconductor alloy layer.

In the present invention, the forming of the metallic contact comprises a non-epi-epitaxial raised/source drain approach comprising an electroless deposition of at least one metal from Group VIII or IB of the Periodic Table and at least one of B, P, Mo and Re. In some embodiments, the electroless deposition further comprises a palladium seed layer.

In a first embodiment of the inventive method, the forming the etch stop liner and the stressed layer comprises depositing an etch stop liner and a stressed layer over the semiconductor substrate and the first semiconductor alloy layer located within the lower layer of polysilicon, providing a patterned photoresist that has at least one opening that is perpendicular to the lower layer of polysilicon, said at least one opening located within an active area of said substrate and outside said active area, performing a first etch that removes the stressed layer not protected by said patterned photoresist, and performing a second etch that removes the etch stop liner not protected by the patterned photoresist.

In a second embodiment of the inventive method, the forming the etch stop liner and the stressed layer comprises depositing an etch stop liner and a stressed layer over the semiconductor substrate and the first semiconductor alloy layer located within the lower layer of polysilicon, providing a patterned photoresist that has at least one opening that is perpendicular to the lower layer of polysilicon, said at least one opening is located only within an active area of the substrate, performing a first etch that removes the stressed layer not protected by the patterned photoresist, and performing a second etch that removes the etch stop liner not protected by the patterned photoresist. In this second embodiment of the inventive method, a stack of another etch stop layer and another stressed layer is formed on a trench isolation region located within the semiconductor substrate and a portion of the second semiconductor metal alloy layer abutting the trench isolation region.

The method of the present invention also includes a step of forming a middle-of-the-line dielectric material having at least one contact via that is in contact with the second semiconductor alloy layer.

BRIEF DESCRIPTION OF THE DRAWINGS

FIGS. 2-12B are pictorial representations (through various views) depicting the basic processing steps that are employed in one embodiment of the present invention.

FIGS. 13A-15 are pictorial representations (through various view) depicting the basic processing steps that are employed in another embodiment of the present invention; this embodiment provides the structure shown in FIGS. 1A-1B mentioned above.

DETAILED DESCRIPTION OF THE INVENTION

The present invention, which provides a semiconductor structure having improved device performance and chip yield as a result of a stressed layer located atop a gate conductor stack and a metallic contact located atop metal semiconductor alloy-containing source/drain diffusion regions and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Before discussing the invention in detail, it is noted that in the drawings that accompany the present invention two views are sometimes shown. In the cases where two views are shown, the drawing including the designation "A" is a view looking down on the structure, while the drawing including designation "B" is a cross sectional view through cut A-A shown in the top down view.

As stated above and as is shown in FIGS. 1A-1B and 12A-12B, the present invention provides a semiconductor structure 100 that includes at least one field effect transistor 102 located on a surface of a semiconductor substrate 12 in the active area AA. The at least one field effect transistor 102 includes a gate conductor stack comprising a lower layer of polysilicon 20' and an upper layer of a first metal semiconductor alloy 34A. The gate conductor stack has sidewalls S1 and S2 that include at least one spacer 30 and a top surface that includes an etch stop liner 36 and a stressed layer 38. As is illustrated, the etch stop liner 36 is located on a bottom surface and sidewall surfaces of the stressed layer 38.

The inventive structure shown in FIGS. 1A-1B and 12A-12B includes a second metal semiconductor alloy layer 34B located within the semiconductor substrate 12 at a footprint of said at least one spacer 30. A metallic contact 42 comprising a metal from Group VIII or IB of the Periodic Table of Elements and at least one of W, B, P, Mo and Re is located on the second metal semiconductor alloy layer 34B.

In the present invention, the first and second metal semiconductor alloy layers (34A and 34B, respectively) comprise the same or different material. The second metal semiconductor alloy layer 34B is located within a source diffusion region and a drain diffusion region (each labeled as 32 in the drawing) of the at least one transistor 102.

The semiconductor structure 100 further includes a barrier layer 44 located atop the metallic contact 42 and the at least one transistor 102. A middle-of-the-line (MOL) dielectric 46 including a contact via 48 comprised of a conductive metal is located within the structure, wherein the contact via 48 is in contact with the metallic contact 42. A diffusion barrier liner 50 is typically present within the contact via 48.

A trench isolation region 14 is located within the semiconductor substrate 12, wherein an outer edge 14A of the trench isolation region 14 is in contact with an edge E of the second metal semiconductor alloy layer 34B.

As shown, a gate dielectric material 20 is present between the gate conductor stack 104 and the semiconductor substrate 12.

Figure 1A:
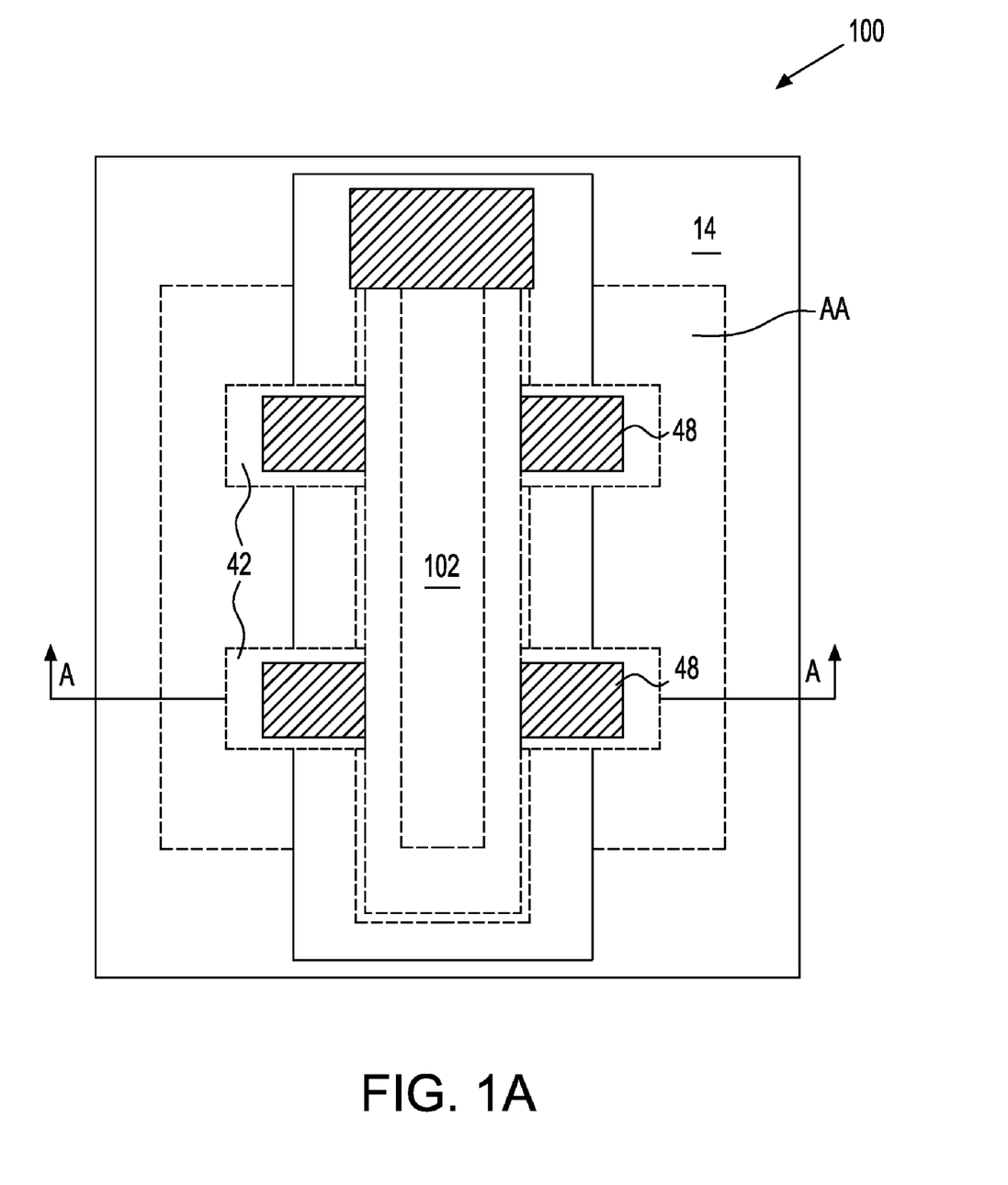
FIGS. 1A and 1B are pictorial representations (through a top-down view and a cross sectional view through cut A-A) of the inventive structure.
Figure 1B:
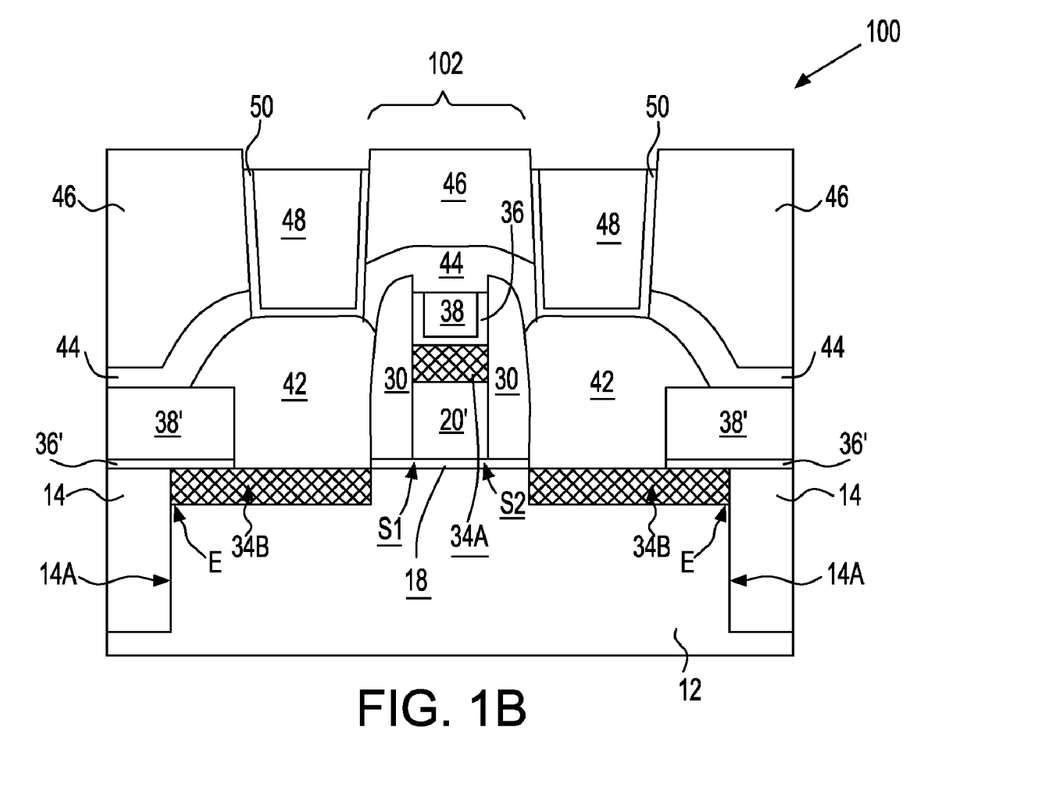

In some embodiments of the present invention as shown in FIG. 1B, a stack of another etch stop layer 36' and another stressed layer 38' is located on the trench isolation region 14 and a portion of the second semiconductor metal alloy layer 34B that abuts the trench isolation region 14.

Figure 2:
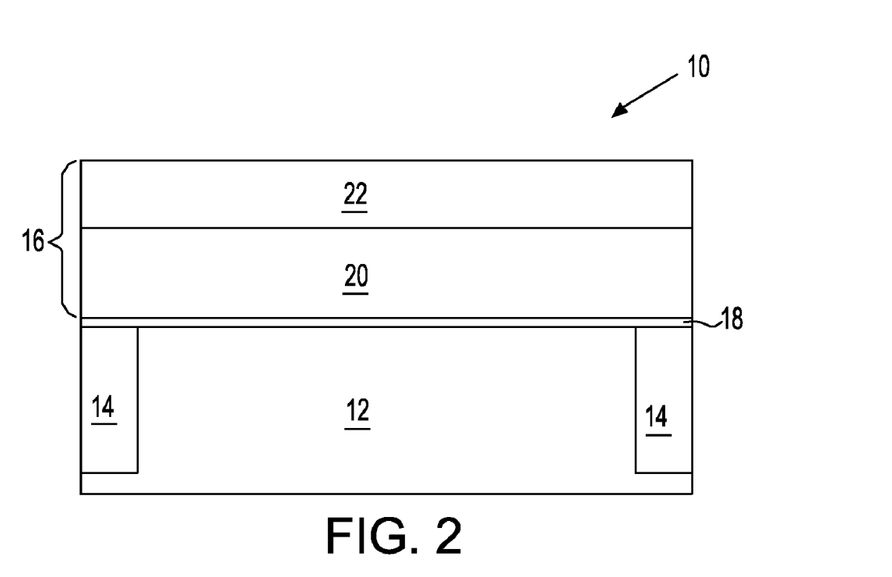

Reference is now made to FIGS. 2-12B which are pictorial representations of the basic processing steps that are employed in accordance with a first embodiment of the present invention. In the first embodiment, the stack of another etch stop layer 36' and another stressed layer 38' is not formed. Specifically, FIG. 2 illustrates an initial structure 10 that is employed in the present invention in fabricating the structure shown in FIGS. 12A-12B. Specifically, the initial structure 10 includes a semiconductor substrate 12 having at least one trench isolation region 14 located therein. Atop the semiconductor substrate 12 there is present a material stack 16 that includes, from bottom to top, a gate dielectric 18, a layer of polysilicon (polySi) 20 and a layer of polySiGe 22.

The initial structure 10 shown in FIG. 2 is comprised of materials that are well known to those skilled in the art. Also, conventional techniques are used in forming the same. For example, the semiconductor substrate 12 comprises any semiconductor material including, for example, Si, Ge, SiGe, SiC, SiGeC, Ga, GaAs, InAs, InP and all other III/V or II/VI compound semiconductors. Semiconductor substrate 12 may be a layered semiconductor such as, for example, Si/SiGe, Si/SiGeC, or a semiconductor-on-insulator (SOI). When an SOI substrate is employed a buried insulating such as, for example, a buried oxide or a buried nitride is located between top and bottom semiconductor layers. The buried insulator may be continuous or it may be discontinuous. In some embodiments of the present invention, the semiconductor substrate 12 is a Si-containing substrate, i.e., a semiconductor material that includes silicon. The semiconductor substrate 12 may be doped, undoped or contain regions and/or surfaces that are doped and other regions and/or surfaces that are undoped.

The semiconductor substrate 12 may be strained, unstrained or contain strained regions and unstrained regions therein. The semiconductor substrate 12 may have a single crystal orientation or it may be a hybrid orientation semiconductor substrate that has at least two surfaces regions that have different crystallographic orientations.

The at least one trench isolation 14 that is located within the semiconductor substrate 12 is formed utilizing a conventional process well known to those skilled in the art. Typically, the at least one trench isolation region 14 is formed by providing a patterned mask having at least one opening on the surface of the semiconductor substrate by deposition and lithography, etching is then used to etch a trench into the semiconductor substrate 12. The depth of the trench may vary and is not critical to the present invention. Next, the trench is filled with a trench dielectric material such as $SiO_2$ or TEOS (tetraethylorthosilicate) utilizing a deposition process. After filling of the trench, a planarization process such as, for example, chemical mechanical polishing (CMP) and/or grinding is employed to provide a planar structure. An optional trench linear can be formed within the trench prior to trench dielectric fill, and an optional densification step may also be performed.

Prior to forming the material stack 16, the surface of the semiconductor substrate 12 is cleaned to remove any residual layers (e.g., native oxides), foreign particles, and any residual metallic surface contamination and to temporarily protect the surface of the semiconductor substrate 12. Any residual silicon oxide is first removed in a solution of hydrofluoric acid. The preferred removal of particles and metallic contamination is based on the industry standard gate dielectric preclean known as RCA clean. The RCE clean includes a treatment in a solution of ammonium hydroxide ($NH_4OH$) and hydrogen peroxide ($H_2O_2$) followed by an aqueous mixture of hydrochloric acid and an oxidizing agent (e.g., $H_2O_2$, and $O_3$). As a result, the cleaned substrate surface is 'sealed' with a very thin layer of chemical oxide (not shown). While the chemical oxide is typically made thinner than about 10 Å so to not interfere with the properties of the gate dielectric 18, its thickness can be varied to beneficially alter properties of the gate dielectric 18.

A blanket layer of gate dielectric 18 is formed on the entire surface of the semiconductor substrate 12 including atop the isolation region 14. The gate dielectric 18 can be formed by a thermal growing process such as, for example, oxidation, nitridation or a combination thereof. Alternatively, the gate dielectric 18 can be formed by a deposition process such as, for example, chemical vapor deposition (CVD), plasma-enhanced chemical vapor deposition (PECVD, atomic layer or pulsed deposition (ALD or ALPD), evaporation, reactive sputtering, chemical solution deposition or other like deposition processes. The gate dielectric 18 may also be formed utilizing any combination of the above processes.

The gate dielectric 18 is comprised of an insulating material having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 18 employed in the present invention includes, but is not limited to: an oxide, nitride, oxynitride and/or silicates including metal silicates, aluminates, titanates and nitrides. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof.

The physical thickness of the gate dielectric 18 may vary, but typically, the gate dielectric 18 has a thickness from about 0.5 to about 10 nm, with a thickness from about 0.5 to about 2 nm being more typical.

After forming the gate dielectric 18, a blanket layer of polysilicon 20 is formed on the gate dielectric 18 utilizing a known deposition process such as, for example, physical vapor deposition, CVD, or evaporation. The thickness, i.e., height, of the layer of polysilicon 20 deposited at this point of the present invention may vary depending on the deposition process employed. Typically, the layer of polysilicon 20 has a thickness from about 20 to about 180 nm, with a thickness from about 50 to about 100 nm being more typical.

After forming the polysilicon layer 20 atop the gate dielectric 18, a layer of polysilicon germanium (polySiGe) 22 is formed on the polysilicon layer 20. The layer of polySiGe 22 can be formed in a separate deposition step from that used in forming the layer of polySi or the layer of polySiGe 22 can be formed in the same deposition step as that used in forming the layer of polysilicon by introducing Ge atoms into the deposition precursor stream. The thickness of the layer of polySiGe 22 may vary depending on the deposition technique used in forming the same. Typically, the layer of polySiGe 22 has a thickness from about 10 to about 100 nm, with a thickness from about 10 to about 50 nm being even more typical.

Figure 3:
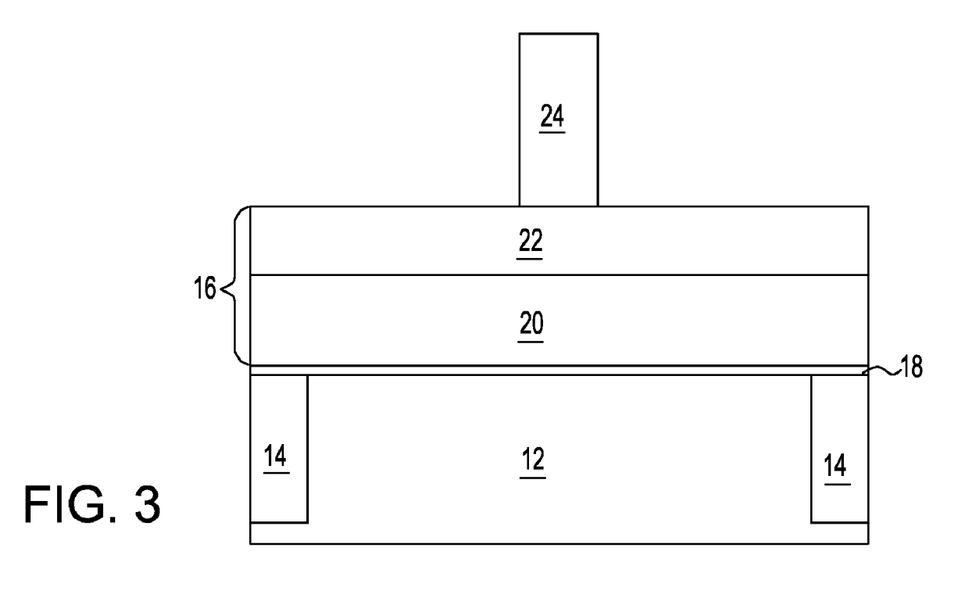

FIG. 3 illustrates the initial structure 10 shown in FIG. 2 including a patterned photoresist 24 located on a surface of the layer of polySiGe 22. The patterned photoresist 24 is formed by first depositing a resist material (not shown) on the entire surface of the layer of polySiGe 22. The resist material may be an organic resist material, an inorganic resist material or a hybrid resist material. After depositing the resist material onto the surface of the layer of polySiGe 22, the resist material is subjected to a lithographic process. The lithographic process includes exposing the resist material to a pattern of radiation and developing the exposed resist utilizing a conventional resist developer.

Figure 4:
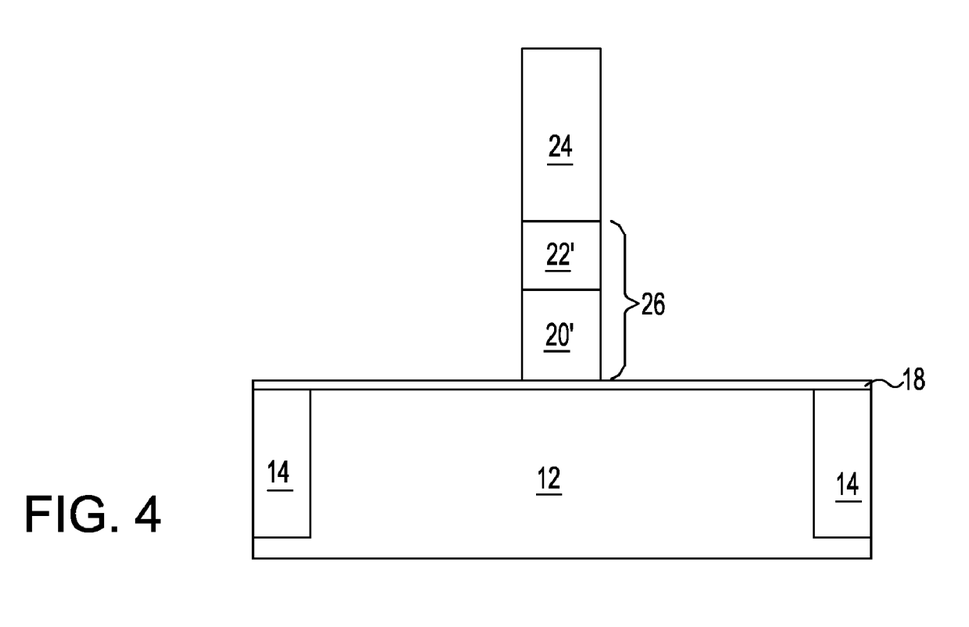

FIG. 4 illustrates the structure that is formed after performing an etching step that removes portions of the layer of polySiGe 22 and the layer of polySi 20 that are not protected by the patterned photoresist 24. The etching step includes dry etching (i.e., reactive ion etching, ion beam etching, plasma etching or laser ablation), chemical wet etching (i.e., an etching process that includes a chemical etchant) or a combination thereof. Typically, reactive ion etching is employed in forming the patterned structure shown in FIG. 4. It is noted that the etching step creates a patterned material stack 26 comprising a patterned layer of polySiGe 22' and a patterned layer of polySi 20'. It is also noted that the etching step typically stops on an upper surface of the gate dielectric 18.

In some embodiments, as shown in FIG. 4, a single patterned material stack 26 is formed. In other embodiments of the present invention, a plurality of such patterned material stacks can be formed utilizing a plurality of patterned photoresists and the etching step described above.

Figure 5:
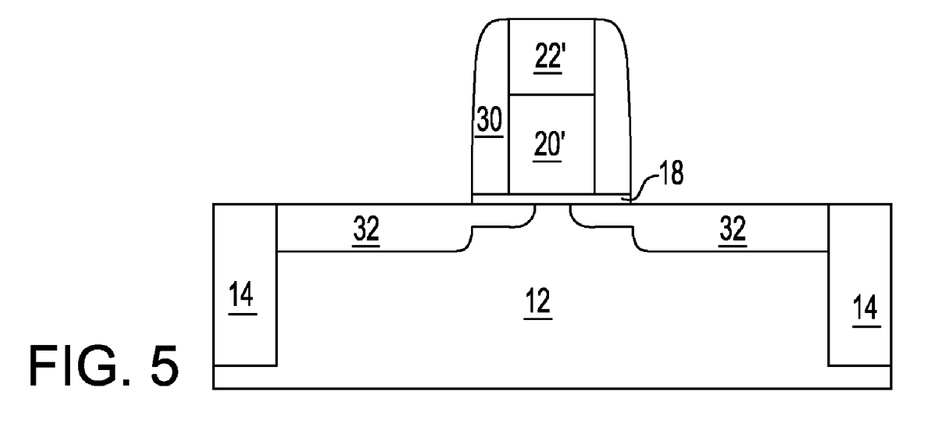

After forming the patterned material stack 26, the patterned photoresist 24 is removed from the structure utilizing a conventional resist stripping process such as, for example, ashing. Next, conventional CMOS processing steps are performed to provide the structure shown, for example, in FIG. 5. Specifically, source/drain extension regions (not specifically labeled) are formed utilizing a conventional extension ion implantation process. An optional anneal process may follow the extension ion implant. In some embodiments, a halo implant (not shown) can be formed at this point of the inventive process utilizing a conventional halo ion implantation process. In some embodiments of the present invention and prior to formation of the source/drain extension regions, a gate reoxidation process can be performed to provide a thin oxide (not shown) on the sidewalls of the patterned material stack 26.

Next, at least one spacer 30 is formed by deposition and etching. The at least one spacer 30 comprises a dielectric material including, for example, an oxide, a nitride or an oxynitride. Typically, the at least one spacer 30 comprises an oxide of silicon and/or a nitride of silicon. The at least one spacer 30 must be sufficiently wide enough such that the source and drain metal semiconductor alloy layer (to be subsequently formed) does not encroach underneath the edges of the patterned material stack 26. Typically, the source/drain metal semiconductor alloy layers do not encroach underneath the edges of the material stack 26 when the at least one spacer 30 has a width, as measured at the bottom, from about 15 to about 200 nm. It is noted that during the spacer etch, exposed portions of the gate dielectric 18 are also removed.

After the at least one spacer 30 formation, source/drain diffusion regions 32 are formed into the semiconductor substrate 12; the source/drain diffusion regions 32 include the S/D extension regions mentioned above. The source/drain diffusion regions 32 are formed utilizing ion implantation and an annealing step. The annealing step serves to activate the dopants that were implanted by the previous implant step (or steps if annealing was not previously been performed to activate the dopants within the extension implant regions). At this point of the present invention, a buffer implant may be performed to provide the source/drain regions with a graded junction that optimizes the series resistance of the device.

Figure 6:
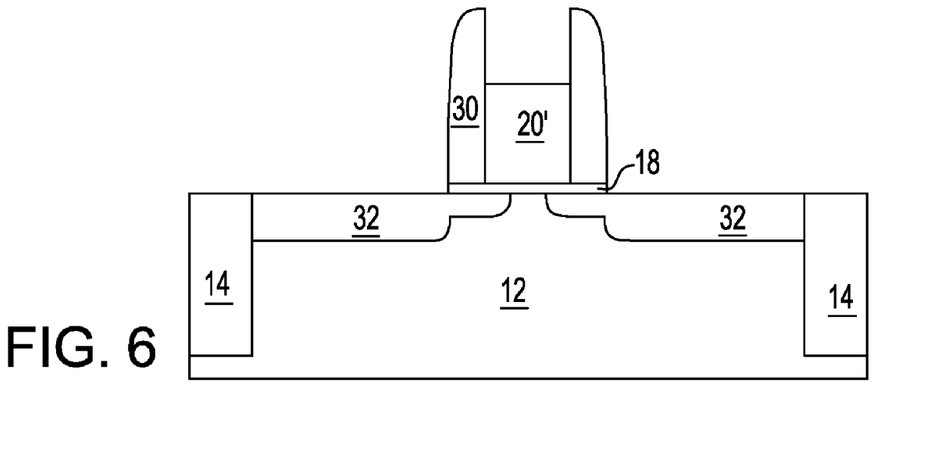

Next, the patterned layer of polySiGe 22' is etched selective to the patterned layer of polySi 20' to provide the structure shown, for example, in FIG. 6. The selective etch comprises any RIE or wet etching process that can remove SiGe selective to Si. An example of such a selective RIE process is any $C_xF_y$ gas such as, for example, $CF_4$ or $CHF_3$. Note that after the selective etching process has been performed, the patterned layer of polySi 20' is exposed.

Figure 7:
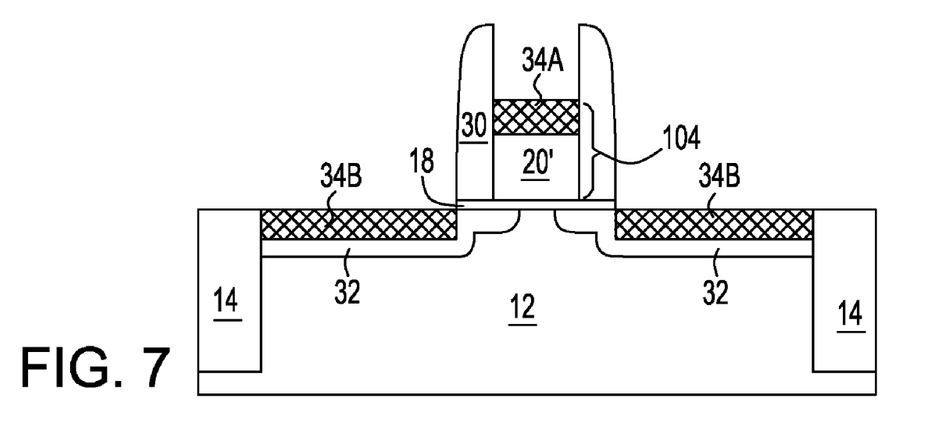

FIG. 7 illustrates the structure that is formed after formation of a first metal semiconductor alloy layer 34A atop of the surface of the patterned layer of polysilicon 20' and a second metal semiconductor alloy 34B within the source/drain diffusion regions 32. It is emphasized that the first metal semiconductor alloy 34A and the patterned layer of polysilicon 20' form a gate conductor stack 104 of the inventive structure.

The first metal semiconductor alloy layer 34A and the second metal semiconductor alloy 34B are comprised of the same or different metal semiconductor alloy. When the first and second semiconductor alloy layers are comprised of the same material, a metal that is capable of thermally reacting with a semiconductor material is deposited atop the structure shown in FIG. 6. The metal is typically one of Ti, W, Co, Ni, Pt and Pd, with one of Ti, W, Co and Ni being more preferred. The metal may include an alloying additive such as, for example, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho Tm, Yb, Lu and mixtures thereof. When present, the alloying additive is present in amounts up to about 50 atomic percent. The metal is formed by a conventional deposition process including, for example, chemical vapor deposition, plasma enhanced chemical vapor deposition, plating, sputtering, chemical solution deposition, atomic layer deposition, physical vapor deposition and other like techniques. The alloying additive can be formed at the same time as the metal or it can be adding to the metal after deposition thereof, or it can be co-deposited atop the metal in a separate layer.

The thickness of the deposited metal can vary. Typically, and for applications in FETs, the metal that is deposited has a thickness from about 5 to about 15 nm.

Following formation of the metal, an optional diffusion barrier such as TiN or TaN may be formed atop the metal prior to annealing. Annealing is performed under conditions that are sufficient in causing the metal and semiconductor to react together forming a metal semiconductor alloy layer, i.e., a metal silicide or a metal germanide. The anneal may be performed in a single step or a two-step anneal process can be used. The anneal is performed at a temperature of about 300° C. or greater, with a temperature from about 400° to about 700° C. being more typical. The optional diffusion barrier is removed after the single anneal process or after the first anneal of the two-step anneal utilizing a conventional process well known to those skilled in the art. Annealing can be performed in a forming gas, He, Ar, or $N_2$. The anneal includes a furnace anneal, a rapid thermal anneal, a spike anneal, a microwave anneal or a laser anneal. Typically, the anneal is a rapid thermal anneal in which the anneal time is about typically less than a minute. Following the final anneal step, any unreacted metal is removed from the structure.

When the first and second metal semiconductor alloy layers (34A and 34B) are comprised of different materials, a block mask is formed over one of the gate stack or the source/drain diffusion regions and then the above procedure is followed. Following formation of one of the metal semiconductor alloy layers, another block mask is formed over the region including the previous formed metal semiconductor alloy layer and the above procedure is also followed, but for the utilization of a different metal.

Figure 8A:
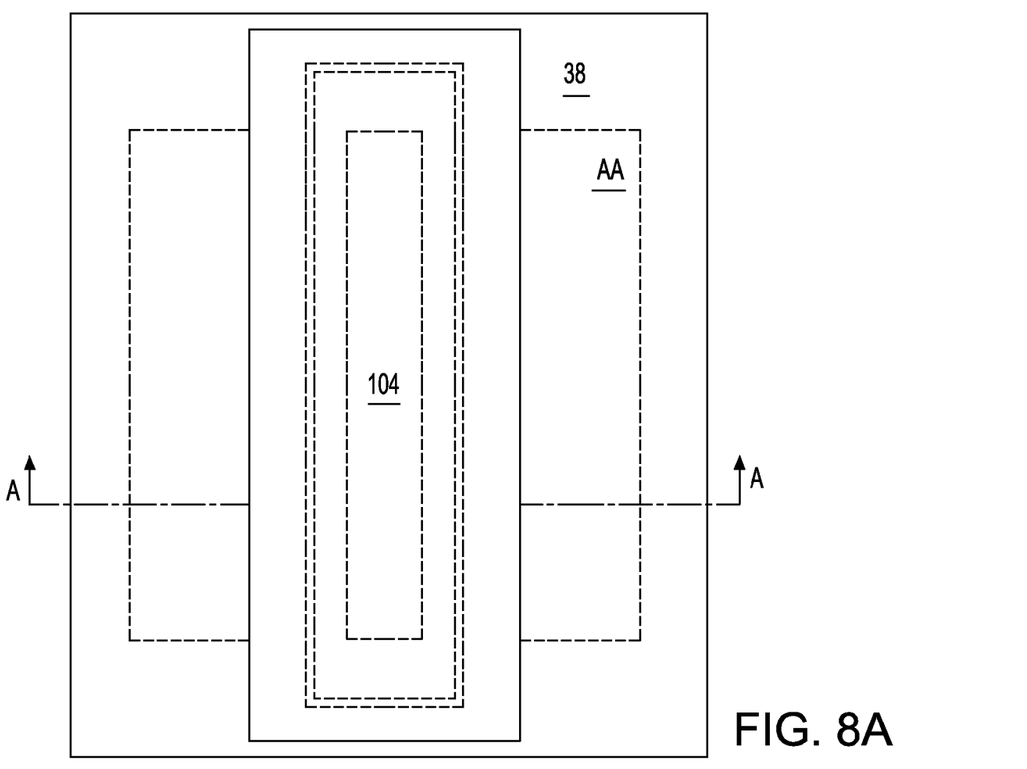
Figure 8B:
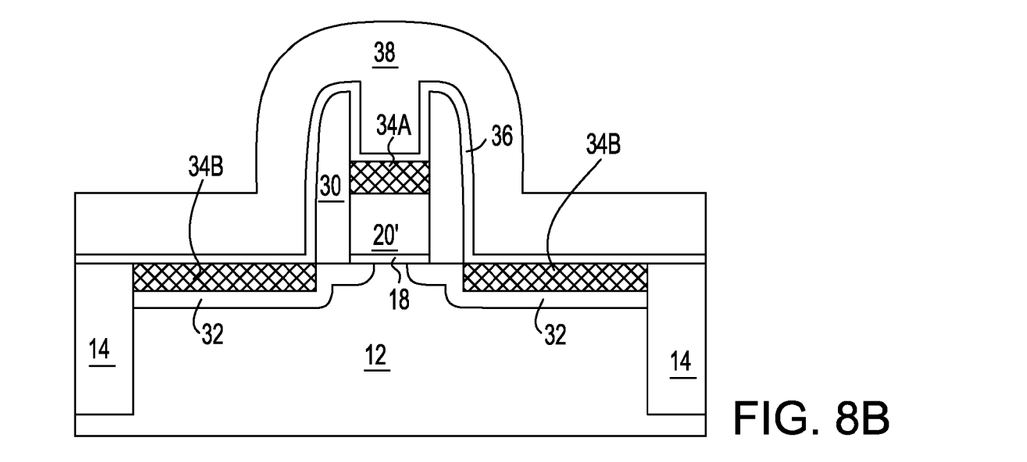

Reference is now made to FIGS. 8A and 8B which illustrate the structure after formation of an etch stop liner 36 and a stressed layer 38; in the top down view illustrated in FIG. 8A, the designation AA denotes the active area of the transistor located within substrate 12. The etch stop liner 36 comprises a dielectric material that is compositionally different from that of the stressed layer 38. Typically, the etch stop liner 36 is an oxide, with an oxide of silicon being highly preferred. The etch stop liner 36 is a thin layer having a thickness from about 3 to about 15 nm, with a thickness from about 5 to about 12 nm being even more preferred. The etch stop liner 36 is formed utilizing a conventional deposition process including, but not limited to CVD, PECVD, PVD, evaporation and chemical solution deposition. Note that the etch stop liner 36 covers the exposed inner surface of the at least one spacer 30 as well as the exposed surface of the first metal semiconductor alloy 34A formed within the patterned layer of polySi 20'.

The stressed layer 38 is then formed atop the etch stop liner 36 liner providing the structure shown in FIGS. 8A and 8B. Specifically, the stressed layer 38 comprises a material that has a stress intended to compliment and enhance performance of a transistor. When the transistor is an n-FET, the stress is preferably a tensile stress that provides a tensile stress within the channel of the transistor in the source/drain direction. Under those circumstances, an electron charge carrier mobility within the transistor is enhanced. Conversely, when the transistor is a p-FET, a compressive stress of an overlying layer is desirable for purposes of generating compressive channel stress in the source/drain direction that yields an enhanced hole mobility. Within the instant embodiment, the transistor is preferably an n-FET and the stressed layer 38 preferably comprises a tensile stressed layer.

The stressed layer 38 may comprise any of several stressed materials. Non-limiting examples includes nitrides and oxynitrides. Nitrides are particularly common stressed layer materials insofar as different magnitudes and types of stress may be introduced into a nitride layer material by using different deposition conditions for forming the nitride layer. Particular deposition conditions that affect nitride layer stress include a changing of the ratio of a low frequency plasma to a high frequency plasma at a temperature range from about 200 to about 600° C. Typically, the stressed layer 38 comprises a nitride material that has a deposited thickness from about 300 to about 1500 angstroms, although the invention is not limited to stressed layers comprising only nitride materials.

Figure 9A:
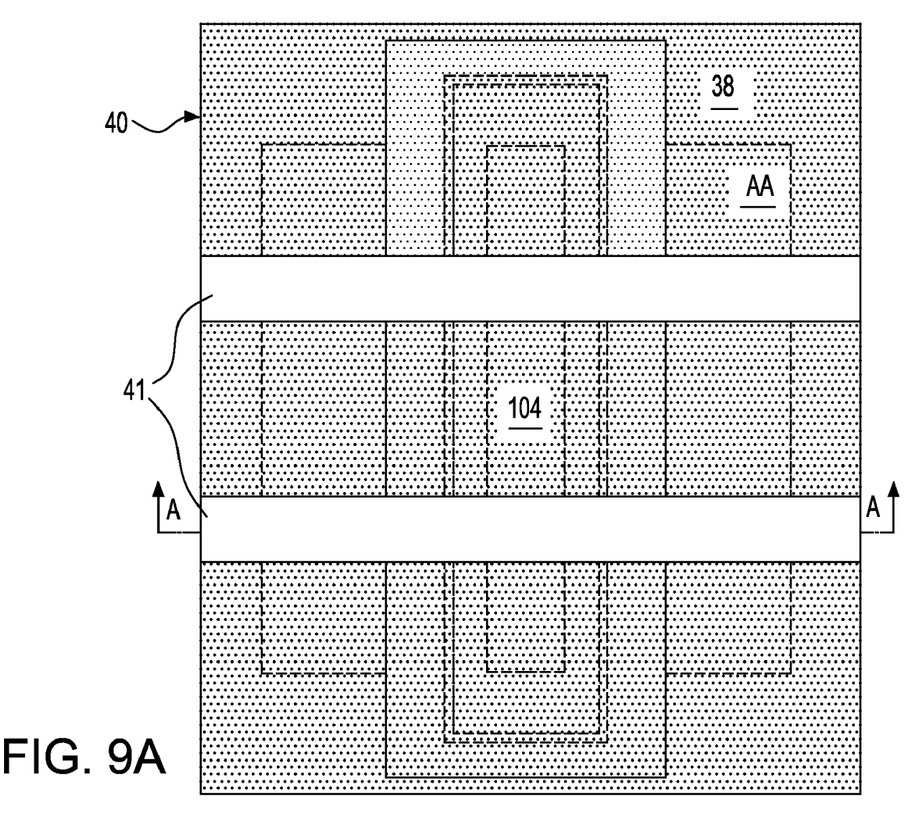
Figure 9B:
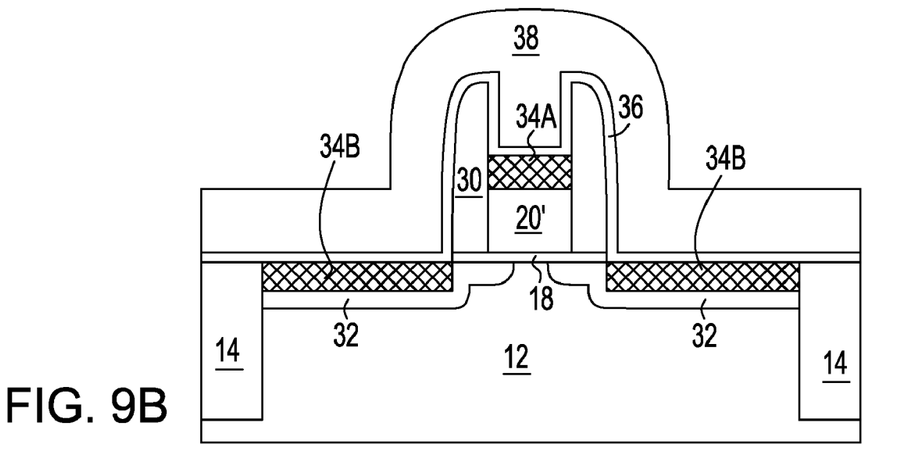

Reference is now made to FIGS. 9A-9B which illustrate the structure after forming a patterned photoresist 40 on the surface of the structure which has openings 41 that are perpendicular to the gate conductor stack 104 including the patterned layer of polySi 20'. The patterned photoresist 40 is formed utilizing conventional lithography as described above. Note that openings 41 are present within and outside the AA of the structure.

Figure 10:
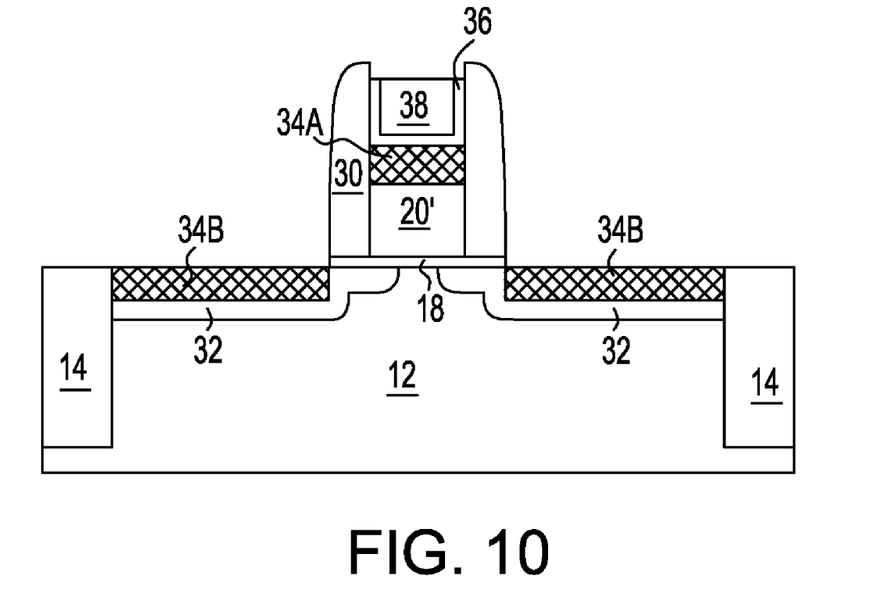

Next, the structure shown in FIGS. 9A-9B is subjected to etching steps that first remove the stressed layer 38 stopping on the etch stop liner 36, and then remove the etch stop liner 36 selectively to the remaining stressed layer and the second metal semiconductor alloy layer 34B located within the source/drain diffusion regions 32. The etching occurs through the openings 41 that are present in the patterned photoresist 40. The first etching step that removes the stressed layer 38 while stopping on the underlying etch stop liner comprises a reactive ion etching process that utilizes $CF_4/O_2$ chemistries. The second etch which removes the etch stop liner 36 selective to the remaining stressed layer and the metal semiconductor alloy comprises a reactive ion etching process that utilizes CHF$_3$/CO chemistries. The resultant structure that is formed after the above etching steps have been performed is shown, for example, in FIG. 10.

At this point of the instant method, the patterned photoresist 40 is removed utilizing a conventional resist stripping process such as, for example, ashing.

Figure 11:
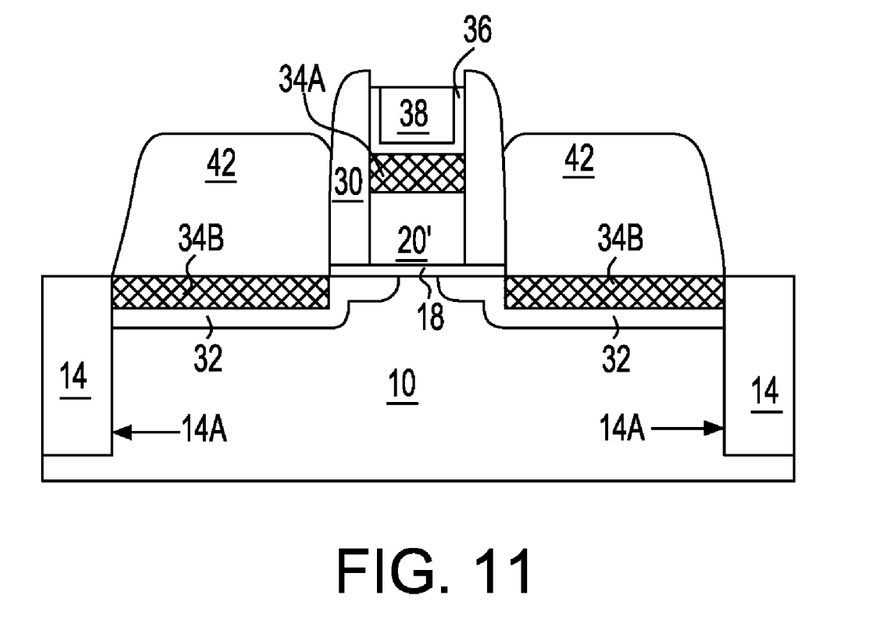

Following the removal of the patterned photoresist 40, a metallic contact 42 is formed selectively atop each of the second metal semiconductor alloy layers 34B that are located atop the source/drain diffusion regions 32; the metallic contact 42 is self-aligned to the outer edge of the abutting spacer 30 and to the outer edge 14A of the trench isolation region 14. The resultant structure including the metallic contact 42 is shown, for example, in FIG. 11. The metallic contact 42 comprises a metal from Group VIII or IB of the Periodic Table of Elements with at least one of W, B, P, Mo and Re. The metals from Group VIII include Fe, Ru, Os, Co, Rh, r, Ni, Pd and Pt, while the metals from Group IB include Cu, Ag and Au. Preferably, the metallic contact 42 comprises CoW, CoP or CoWP, with CoWP being highly preferred.

The metallic contact 42 is formed utilizing a non-epitaxial raised source/drain approach that reduces the parasitic external resistance. Specifically, the metallic contact 42 is formed by selective deposition utilizing an electroless deposition technique.

In electroless depositions, a redox reaction involving the oxidation of one or more soluble reducing agent(s) and the reduction of one or more metallic ions occurs on the surface of a substrate. For many metals including such as Co, the metal semiconductor alloy surface is sufficiently catalytic for the process to continue. To begin the process, however, the metal semiconductor alloy surface may, in some instances, be first seeded with a thin layer of catalytic material such as palladium to initiate the electroless deposition. More commonly, the substrate is primed with a palladium ion containing solution. Palladium ion undergoes an immersion exchange reaction with the substrate leading to formation of a thin layer (1 to a few mono layer thick) of palladium. Background information on electroless plating is well documented in Industrial Electrochemistry—D. Pletcher and F. C. Walsh (Editor), 2$^{nd}$ Edition, Chapman and Hall, NY 1990, ISBN: 0412304104 and Electroless Plating: Fundamentals and Applications—G. O. Mallory, J. B. Hajdu (Editor) 1990, ISBN: 0815512775. See, also, J. Pan et al. "Novel approach to Reduce Source/drain Series Resistance in High Performance CMOS Devices Using Self-Aligned CoWP Process for 45 nm Node UTSOI Transistors with 20 nm Gate Lengths", VLSI 2006. The contents of the J. Pan et al. article are incorporated herein by reference.

It is noted that no metallic contact is formed directly on the first metal semiconductor alloy layer 34A that is present within the patterned layer of polySi 20'.

Next, a barrier layer 44 is deposited on the entire structure utilizing a conventional deposition process such as, for example, CVD, PECVD and PVD. The barrier layer 44 comprises a dielectric material such as a nitride, with a nitride of silicon being highly preferred. The barrier layer 44 may be a compressive stressed material, a tensile stressed material or a neutral (i.e., non)-stressed material. The barrier layer 44 has a thickness from about 10 to about 50 nm, with a thickness from about 15 to about 30 nm.

Figure 12A:
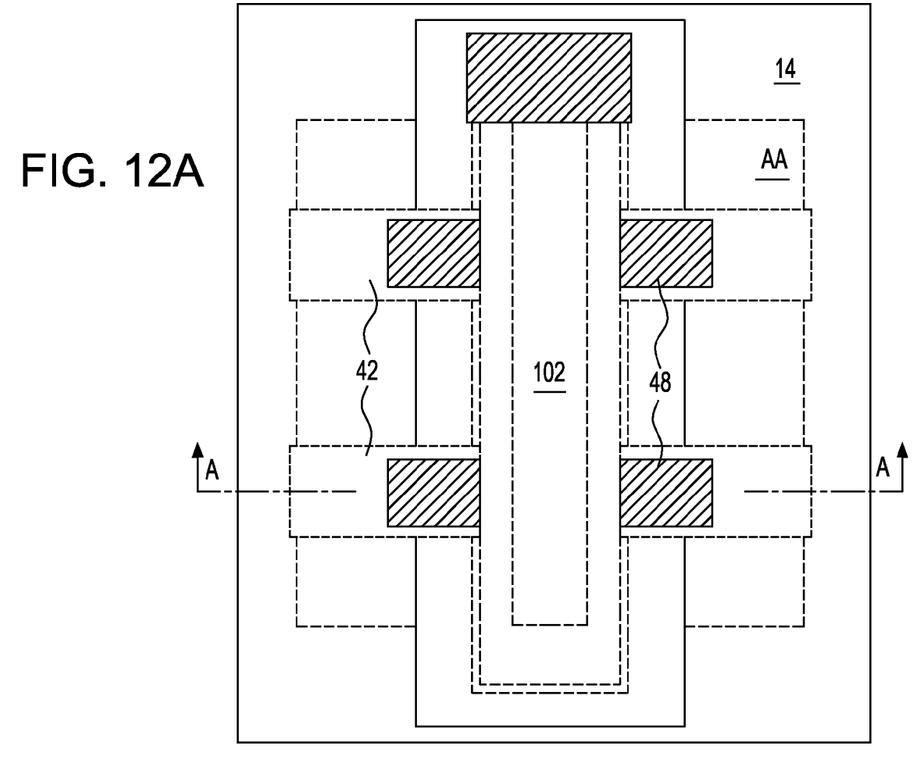
Figure 12B:
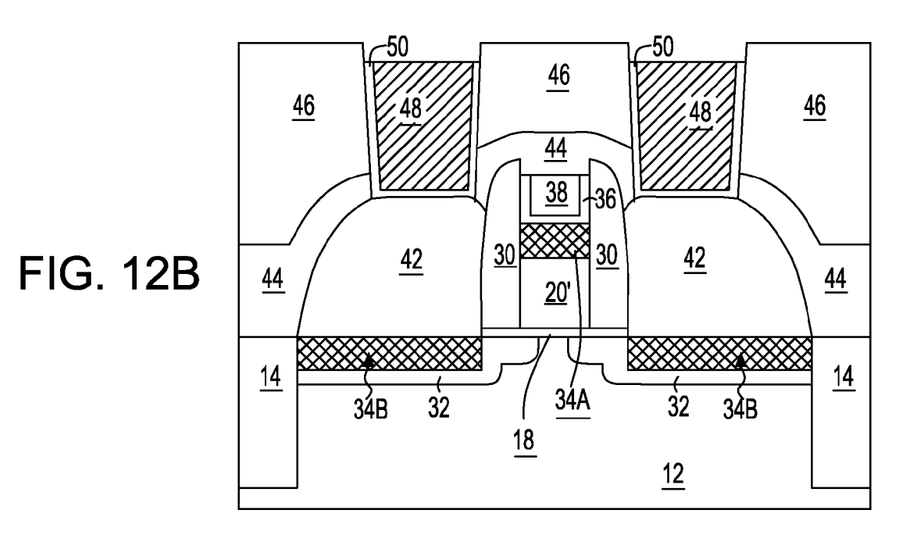

A middle-of-the-line (MOL) dielectric 46 is deposited on the barrier layer 44 and planarized. The MOL dielectric 46 may be undoped silicate glass (USG), fluorosilicate glass (FSG), borophosphosilicate glass (BPSG), a spin-on low-k dielectric layer, or a chemical vapor deposition (CVD) low-k dielectric layer. The MOL dielectric 46 can be formed utilizing a conventional deposition process including, for example, CVD, PECVD, evaporation and spin-on coating. Contact via holes are formed in the MOL dielectric 46 and are filled with a metal such as, for example, Cu, Ti, Al or alloys thereof to form contact vias 48. In some embodiments, and as shown in FIGS. 12A-12B, the contact vias 48 include a diffusion barrier material 50 which is one of Ti, TiN, Ta, TaN, Ru, RuN, W and WN. The diffusion barrier material 50 is formed within the contact via prior to filling the via with a metal by a deposition process including, sputtering, plating, PECVD, CVD and PVD. A planarization process and etching back of the optional diffusion barrier material 50 and the metal of the contact vias 48 may also be performed. FIGS. 12A-12B illustrate the inventive structure after the above processing steps have been performed.

Figure 13A:
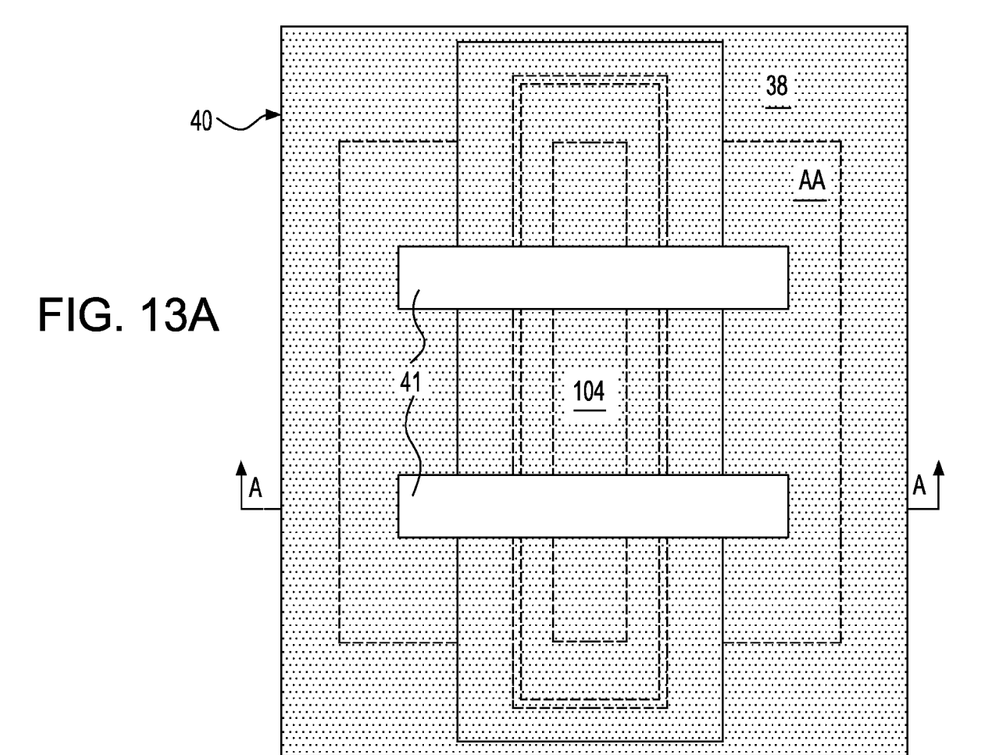

Reference is now made to FIGS. 13A-15 which illustrate processing steps in accordance with a second embodiment of the present invention which leads to the formation of the structure shown in FIGS. 1A-1B. The second embodiment begins by first providing the structure illustrated in FIG. 8 of the first embodiment. Next, and as shown in FIGS. 13A-13B, a patterned photoresist 40' having opening 41' are formed utilizing conventional lithography. Unlike the first embodiment described above, in which the openings were present within and outside the AA, the openings 41' are located only within the AA of the structure.

Figure 13B:
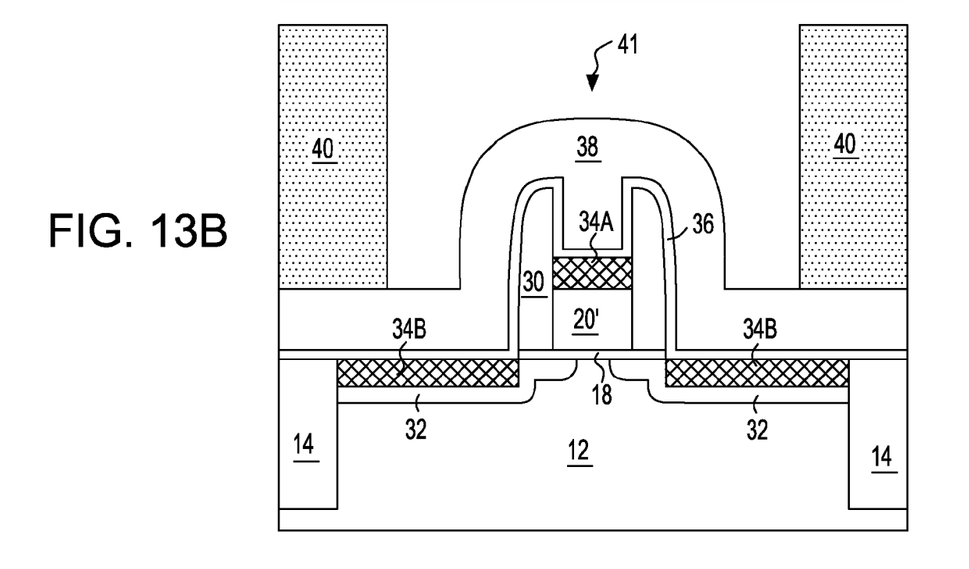
Figure 14:
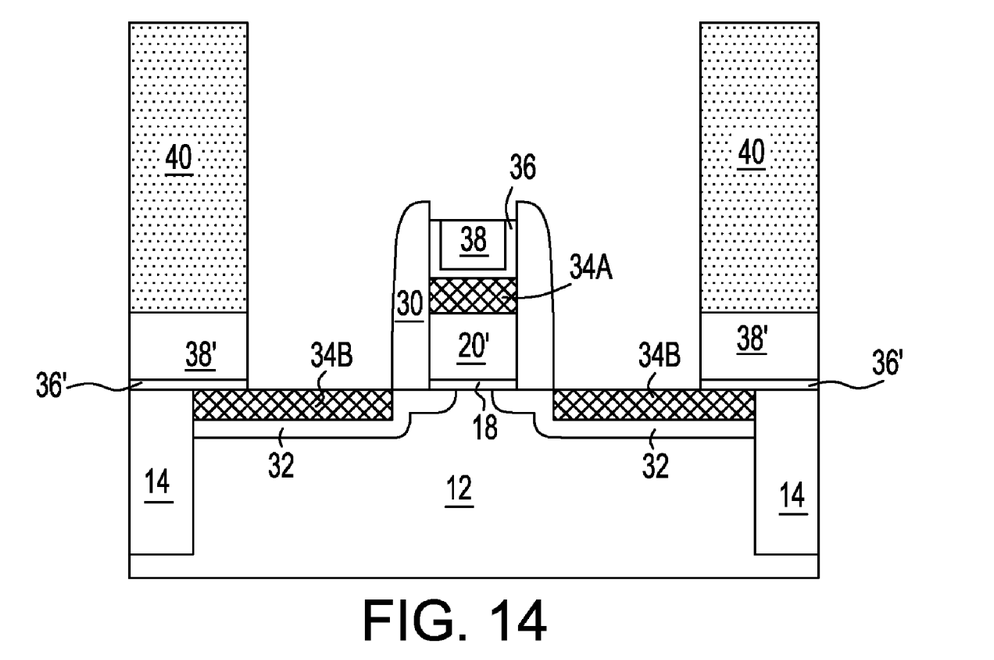

FIG. 14 shows the structure of FIGS. 13A-13B after the exposed stressed layer and the etch stop liner, not protected by photoresist 40' are removed. The etching steps used in forming the structure shown in FIG. 14 are the same as descried above with respect to FIGS. 9A-9B of the first embodiment.

Figure 15:
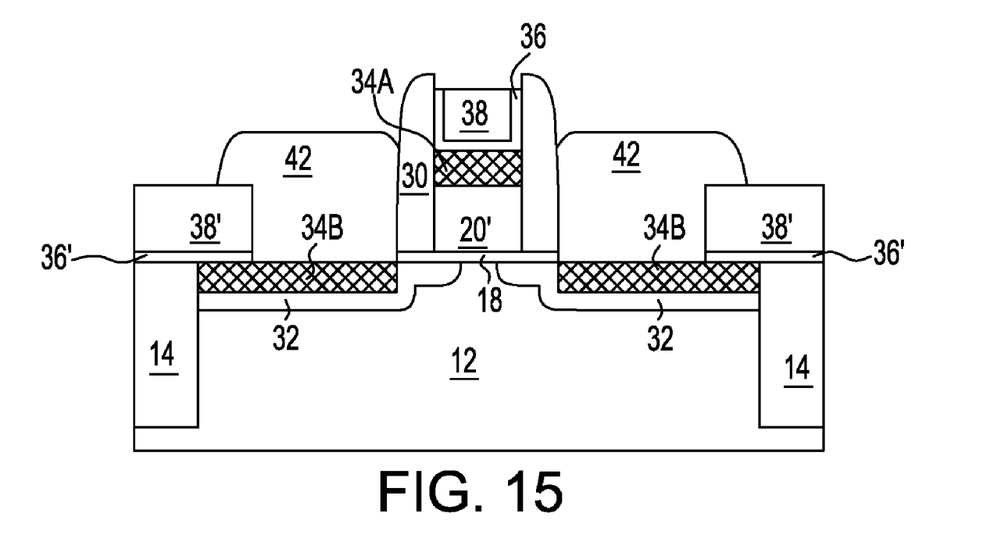

The patterned photoresist 40' is then removed as described above in the first embodiment, and metallic contacts 42 are also formed as also described above in the first embodiment of the present invention. The resultant structure is shown in FIG. 15. Note that in the structure shown in FIG. 15, a stack of another etch stop liner 36' and another stressed layer 38' remain on portions of the second metal semiconductor alloy layer 34B that abut the trench isolation region 14. It is emphasized that the another etch stop liner 36' is composed of the same material as etch stop liner 36. It is also emphasized that the another stressed layer 38' is composed of the same material as the stressed layer 38 located atop the gate conductor stack.

FIGS. 1A-1B illustrates the resultant structure that is formed including barrier layer 44, MOL 46, diffusion barrier material 50 and contact via 48.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer and a top surface that includes an etch stop liner and a stressed layer, said etch stop liner is located on a bottom surface and sidewall surfaces of said stressed layer;

a second metal semiconductor alloy layer located within said semiconductor substrate at a footprint of said at least one spacer; and a metallic contact comprising a metal from Group VIII or IB of the Periodic Table of Elements and at least one of W, B, P, Mo and Re located on said second metal semiconductor alloy layer.

2. The semiconductor structure of claim 1 wherein said second metal semiconductor alloy layer is located within a source diffusion region and a drain diffusion region of said at least one transistor.

3. The semiconductor structure of claim 1 further comprising a barrier layer located atop said metallic contact and said at least one transistor.

4. The semiconductor structure of claim 3 wherein a middle-of-the-line (MOL) dielectric including a contact via is present and said contact via is in contact with said metallic contact.

5. The semiconductor structure of claim 4 wherein said contact via includes a diffusion barrier liner.

6. The semiconductor structure of claim 1 wherein said metallic contact comprises CoW, CoP or CoWP.

7. The semiconductor structure of claim 1 further comprising a trench isolation region located within said semiconductor substrate, wherein an outer edge of said trench isolation region is in contact with an edge of said second metal semiconductor alloy layer.

8. The semiconductor structure of claim 1 wherein said etch stop liner and said stressed layer on the upper layer of said first metal semiconductor alloy each have an upper surface that is below an upper surface of said at least one spacer.

9. The semiconductor structure of claim 7 further comprises a stack of another etch stop layer and another stressed layer located on said trench isolation region and a portion of said second semiconductor metal alloy layer abutting said trench isolation region.

10. The semiconductor structure of claim 1 wherein said stressed layer atop the gate conductor stack is a tensile stressed material.

11. The semiconductor structure of claim 1 wherein said stressed layer atop the gate conductor stack is a compressive stressed material.

12. A semiconductor structure comprising:

at least one field effect transistor located on a surface of a semiconductor substrate, said at least one field effect transistor including a gate conductor stack comprising a lower layer of polysilicon and an upper layer of a first metal semiconductor alloy, said gate conductor stack having sidewalls that include at least one spacer and a top surface that includes an etch stop liner and a stressed layer, said etch stop liner is located on a bottom surface and sidewall surfaces of said stressed layer;

a second metal semiconductor alloy layer located within said semiconductor substrate at a footprint of said at least one spacer;

a metallic contact comprising a metal from Group VIII or IB of the Periodic Table of Elements and at least one of W, B, P, Mo and Re located on said second metal semiconductor alloy layer; and a middle-of-the-line (MOL) dielectric located atop said metallic contact and said at least one transistor, said MOL dielectric including at least one contact via that is in contract with said metallic contact located atop said second metal semiconductor alloy layer.

13. The semiconductor structure of claim 12 wherein said second metal semiconductor alloy layer is located within a source diffusion region and a drain diffusion region of said at least one transistor.

14. The semiconductor structure of claim 12 further comprising a barrier layer located between portions of said MOL dielectric and said metallic contact and said at least one transistor.

15. The semiconductor structure of claim 12 wherein said metallic contact comprises CoW, CoP or CoWP.

16. The semiconductor structure of claim 12 further comprising a trench isolation region located within said semiconductor substrate, wherein an outer edge of said trench isolation region is in contact with an edge of said second metal semiconductor alloy layer.

17. The semiconductor structure of claim 12 wherein said etch stop liner and said stressed layer on the upper layer of said first metal semiconductor alloy each have an upper surface that is below an upper surface of said at least one spacer.

18. The semiconductor structure of claim 16 further comprising a stack of another etch stop layer and another stressed layer located on said trench isolation region and a portion of said second semiconductor metal alloy layer abutting said trench isolation region.

19. The semiconductor structure of claim 12 wherein said stressed layer atop said gate conductor stack is a tensile stressed material.

20. The semiconductor structure of claim 12 wherein said stressed layer atop said gate conductor stack is a compressive stressed material.

* * * * *